(12) United States Patent
MacCrimmon et al.

(10) Patent No.: US 8,298,432 B2
(45) Date of Patent: Oct. 30, 2012

(54) METHOD AND SYSTEM FOR ADJUSTING BEAM DIMENSION FOR HIGH-GRADIENT LOCATION SPECIFIC PROCESSING

(75) Inventors: Ruairidh MacCrimmon, Arlington, MA (US); Nicolaus J. Hofmeester, Danvers, MA (US); Steven P. Caliendo, Ashby, MA (US)

(73) Assignee: TEL Epion Inc., Billerica, MA (US)

( * ) Notice: Subject to any disclaimer, the term of this patent is extended or adjusted under 35 U.S.C. 154(b) by 1100 days.

(21) Appl. No.: 11/864,489

(22) Filed: Sep. 28, 2007

(65) Prior Publication Data

US 2009/0084672 A1   Apr. 2, 2009

(51) Int. Cl.
*G01L 21/30* (2006.01)

(52) U.S. Cl. .................. 216/59; 216/2; 216/38; 216/58; 216/60; 216/66

(58) Field of Classification Search .................. 216/58, 216/59, 66, 2, 38, 60; 215/58, 59, 66
See application file for complete search history.

(56) References Cited

U.S. PATENT DOCUMENTS

| | | | | |
|---|---|---|---|---|
| 6,375,790 B1 * | 4/2002 | Fenner | .................... | 156/345.28 |
| 6,750,460 B2 * | 6/2004 | Greer | .................... | 250/492.2 |
| 7,564,024 B2 * | 7/2009 | Hofmeester et al. | .................... | 250/251 |
| 7,696,495 B2 * | 4/2010 | Mack et al. | .................... | 250/492.21 |
| 7,917,241 B2 * | 3/2011 | Hofmeester et al. | .................... | 700/110 |
| 2002/0014407 A1 * | 2/2002 | Allen et al. | .................... | 204/298.36 |

* cited by examiner

*Primary Examiner* — Nadine G Norton
*Assistant Examiner* — Christopher Remavege
(74) *Attorney, Agent, or Firm* — Oblon, Spivak, McClelland, Maier & Neustadt, L.L.P.

(57) ABSTRACT

A method and system of location specific processing on a substrate is described. The method comprises establishing a gas cluster ion beam (GCIB) according to a set of beam properties and measuring metrology data for a substrate. Thereafter, the method comprises determining at least one spatial gradient of the metrology data at one or more locations on the substrate and adjusting at least one beam property in the set of beam properties for the GCIB according to the determined at least one spatial gradient. Using the metrology data and the adjusted set of beam properties, correction data for the substrate is computed. Following the computing, the adjusted GCIB is applied to the substrate according to the correction data.

18 Claims, 10 Drawing Sheets

METHOD AND SYSTEM FOR ADJUSTING BEAM DIMENSION FOR HIGH-GRADIENT LOCATION SPECIFIC PROCESSING

CROSS-REFERENCE TO RELATED APPLICATIONS

This application is related to U.S. patent application Ser. No. 11/864,461, entitled "METHOD AND SYSTEM FOR MULTI-PASS CORRECTION OF SUBSTRATE DEFECTS", filed on the same date herewith; U.S. Pat. No. 6,537,606, entitled "SYSTEM AND METHOD FOR IMPROVING THIN FILMS BY GAS CLUSTER ION BEAM PROCESSING", and published U.S. Patent Application Publication No. 2002/0005676 A1, entitled "SYSTEM AND METHOD FOR ADJUSTING THE PROPERTIES OF A DEVICE BY GCIB PROCESSING". The entire contents of each application and publication are herein incorporated by reference in their entirety.

BACKGROUND OF THE INVENTION

1. Field of Invention

The invention relates to a method and system for treating a substrate using a gas cluster ion beam (GCIB), and more particularly to a method and system of using a GCIB for location specific processing on a substrate.

2. Description of Related Art

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the workpiece. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing. Conventional cluster ion sources produce cluster ions having a wide size distribution (scaling with the number of molecules in each cluster that may reach several thousand molecules). Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases. Several emerging applications for GCIB processing of workpieces on an industrial scale are in the semiconductor field. Although GCIB processing of a workpiece is performed using a wide variety of gas-cluster source gases, many of which are inert gases, many semiconductor processing applications use reactive source gases, sometimes in combination or mixture with inert or noble gases, to form the GCIB.

SUMMARY OF THE INVENTION

The invention relates to a method and system for location specific processing of a substrate using a gas cluster ion beam (GCIB).

According to one embodiment, a method of, and computer readable medium for, location specific processing on a substrate is described. The method comprises establishing a gas cluster ion beam (GCIB) according to a set of beam properties and measuring metrology data for a substrate. Thereafter, the method comprises determining at least one spatial gradient of the metrology data at one or more locations on the substrate and adjusting at least one beam property in the set of beam properties for the GCIB according to the determined at least one spatial gradient. Using the metrology data and the adjusted set of beam properties, correction data for the substrate is computed. Following the computing, the adjusted GCIB is applied to the substrate according to the correction data.

According to another embodiment, a processing system configured to perform location specific processing on a substrate is described. The processing system comprises: a vacuum vessel; a gas cluster ion beam (GCIB) source disposed in the vacuum vessel, the GCIB source configured to produce a GCIB; a workpiece holder configured to support the workpiece inside the vacuum vessel for treatment by the GCIB; and one or more shaping apertures coupled to the vacuum vessel and aligned with the GCIB, and configured to shape the GCIB prior to the impingement of the GCIB on the substrate.

DETAILED DESCRIPTION

Figure 1:
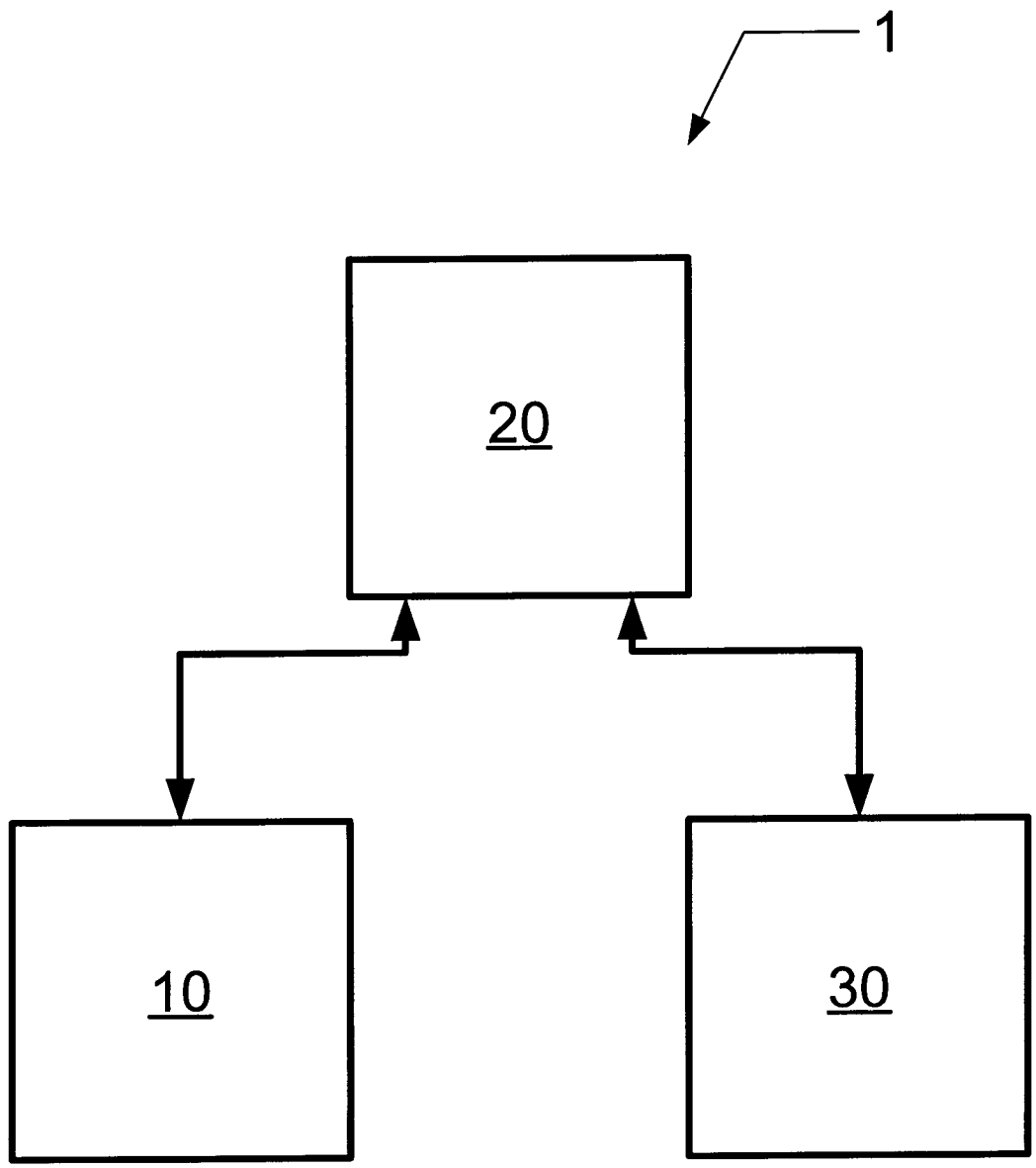
FIG. 1 is an illustration of a processing system according to an embodiment.

A method and system for performing location specific processing on a substrate using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments. Furthermore, reference to "one embodiment" or "an embodiment" refers to an exemplary embodiment of the present invention. One of ordinary skill in the art would understand that the embodiment is not limited to a particular feature, structure, material or characteristic described in connection with that embodiment.

There is a general need for adjusting the properties of a substrate using a gas cluster ion beam (GCIB). For example, the adjustment of properties on a substrate may comprise correcting non-uniformities on the substrate using a GCIB. These non-uniformities can include variations in parametric data for an upper layer of the substrate, such as variations in geometrical, mechanical, electrical and/or optical parameters associated with the upper layer or one or more devices formed in or on the upper layer of the substrate. By correcting non-uniformities of an upper layer of a substrate, and/or systematic non-uniformities caused by inherent variation in a process tool, enhanced yield of viable devices may be provided, as well as a more repeatable and constant process may be obtained. In addition to correcting non-uniformities, the adjustment of properties on a substrate may comprise creating specifically intended variations in an upper layer of the substrate.

As illustrated in FIG. 1, a processing system 1 configured to perform location specific processing on a substrate is described according to one embodiment. The processing system 1 comprises a metrology system 10 configured to acquire metrology data for a substrate, and a GCIB processing system 30 configured to treat the substrate with a GCIB. Furthermore, the processing system 1 comprises a multi-process controller 20 configured to: receive the metrology data from the metrology system 10, compute correction data for the substrate using the metrology data, and instruct the GCIB processing system 30 to apply completed correction data to the substrate using a gas cluster ion beam (GCIB).

Additionally, the multi-process controller 20 is configured to determine at least one spatial gradient of the metrology data at one or more locations on the substrate. Using the determined at least one spatial gradient at one or more locations, the multi-process controller 20 instructs the GCIB processing system 30 or the operator of the GCIB processing system 30 to adjust at least one beam property in an established set of beam properties for the GCIB. For example, the at least one beam property includes a beam resolution, such as a cross-sectional beam dimension or a beam edge profile.

Furthermore, one or more correction steps or passes are performed. For example, according to one embodiment, a first step is performed to correct, adjust or smooth substrate surface asperities having high or finer spatial gradients. The first step includes using a GCIB having a finer beam resolution. Thereafter, a second step is performed to correct, adjust, or smooth substrate surface asperities having low or coarser spatial gradients. The second step includes using a GCIB having a coarser beam resolution. In an alternative embodiment, the order of the above described first and second steps are reversed.

Figure 2:
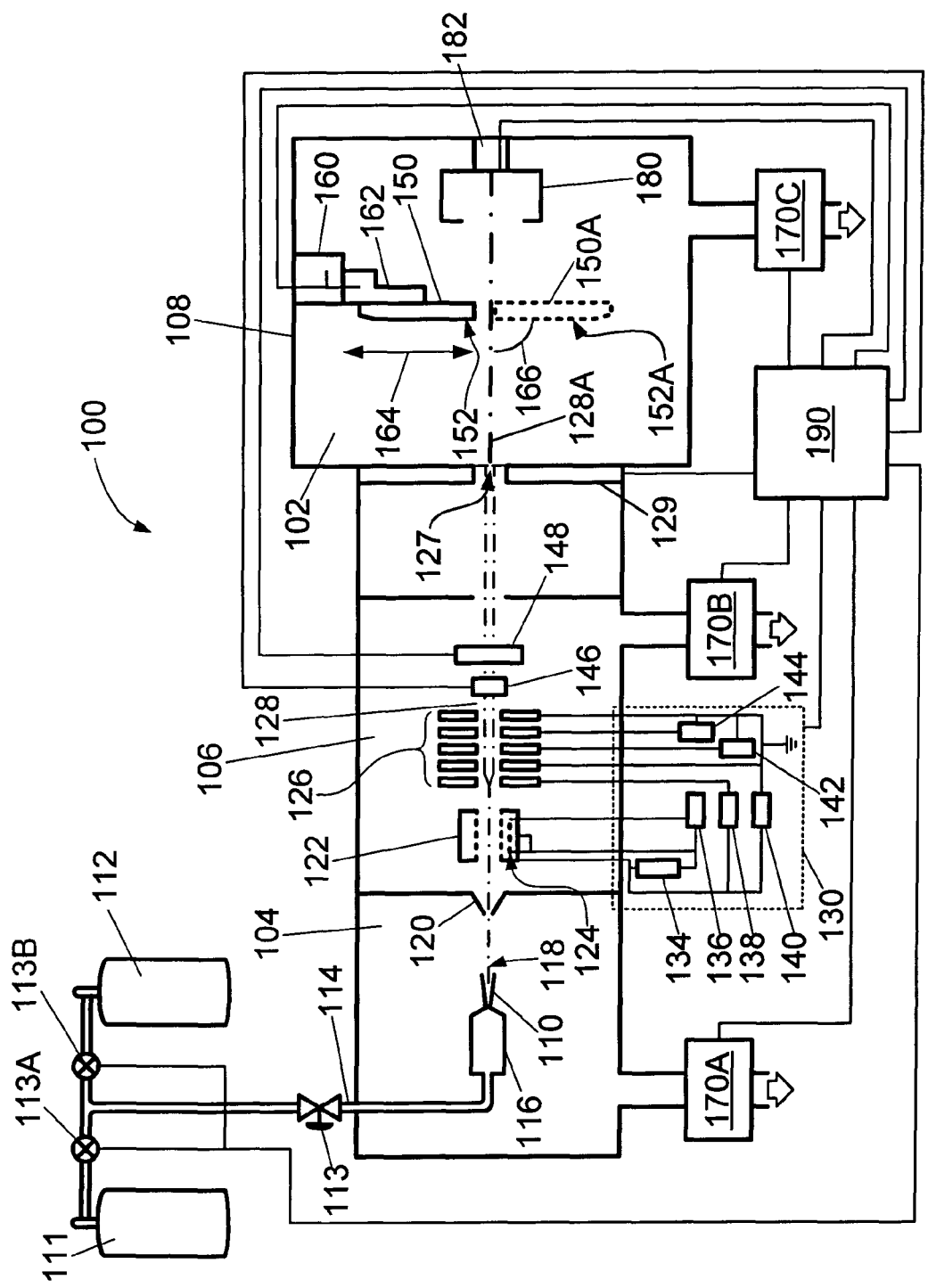
FIG. 2 is an illustration of a GCIB processing system.

According to another embodiment, a GCIB processing system 100 is depicted in FIG. 2 comprising a vacuum vessel 102, substrate holder 150, upon which a substrate 152 to be processed is affixed, and vacuum pumping systems 170A, 170B, and 170C. The substrate 152 is a semiconductor substrate, a wafer, a flat panel display (FPD), a liquid crystal display (LCD), or any other desired workpiece. The GCIB processing system 100 is configured to produce a GCIB for treating the substrate 152.

Referring still to the GCIB processing system 100 in FIG. 2, the vacuum vessel 102 comprises three communicating chambers, namely, a source chamber 104, an ionization/acceleration chamber 106, and a processing chamber 108 to provide a reduced-pressure enclosure. The air in the three chambers is evacuated by vacuum pumping systems 170A, 170B, and 170C, respectively, to create suitable operating pressures. In the three communicating chambers, according to one embodiment, a gas cluster beam is formed in the first chamber, while a gas cluster ion beam is formed in the second chamber wherein the gas cluster beam is ionized and optionally accelerated. In the third chamber, the accelerated or non-accelerated gas cluster ion beam is utilized to treat substrate 152.

A first gas composition stored in a first gas source 111 is admitted under pressure through a first gas control valve 113A to a gas metering valve or valves 113. Additionally, an optional second gas composition stored in a second gas source 112 is admitted under pressure through a second gas control valve 113B to the gas metering valve or valves 113. According to one example, the first gas composition includes a condensable inert gas. For example, the inert gas includes a noble gas, i.e., He, Ne, Ar, Kr, Xe, or Rn. Additionally, according to another example, the second gas composition comprises a film forming gas composition, an etching gas composition, a cleaning gas composition, a smoothing gas composition, etc. In one embodiment, only the first gas source 111 or second gas source 112 is utilized to produce ionized clusters. In another embodiment, the first gas source 111 and the second gas source 112 are utilized in combination with one another to produce ionized clusters comprising helium, neon, argon, krypton, xenon, nitrogen, oxygen, hydrogen, methane, nitrogen trifluoride, carbon dioxide, sulfur hexafluoride, nitric oxide, or nitrous oxide, or any other desired combination of two or more thereof.

The high pressure, condensable gas, comprising the first gas composition or the second gas composition or both, is introduced through a gas feed tube 114 into a stagnation chamber 116 and is ejected into the source chamber 104 through a properly shaped nozzle 110. The source chamber 104 is at a lower pressure than the stagnation chamber 116. Therefore, as the condensable gas moves from the stagnation chamber 116 to the lower pressure region of the source chamber 104, the condensable gas expands and a gas velocity of the condensable gas accelerates to supersonic speeds producing a gas jet 118 emanating from the nozzle 110.

The inherent cooling of the gas jet 118 as static enthalpy is exchanged for kinetic energy, which results from the expansion in the gas jet 118, causes a portion of the gas jet 118 to condense, and form clusters. Each cluster consists of several to several thousand weakly bound atoms or molecules. A gas skimmer 120, positioned downstream from the exit of the nozzle 110 between the source chamber 104 and an ionization/acceleration chamber 106, partially separates the gas molecules on the peripheral edge of the gas jet 118 that have not condensed into a cluster from the gas molecules in the core of the gas jet 118 that have formed clusters. This selection of a portion of gas jet 118, by the gas skimmer 120, can lead to a reduction in the pressure in the downstream regions (e.g., ionizer 122, and processing chamber 108) where higher pressures may be detrimental to the formation of the GCIB 128. Furthermore, the gas skimmer 120 defines an initial dimension for the gas cluster beam (such as beam width or diameter) entering the acceleration/ionization chamber 106.

After the gas jet 118 is formed in the source chamber 104, the constituent gas clusters in the gas jet 118 are ionized by ionizer 122 to form GCIB 128. In one embodiment, the ionizer 122 includes an electron impact ionizer that produces electrons from one or more filaments 124, which are accelerated and directed to collide with the gas clusters in the gas jet 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 2, according to one embodiment, beam electronics 130 are utilized to ionize, extract, accelerate, and focus the GCIB 128. The beam electronics 130 include a filament power supply 136 that provides a voltage VF to heat the ionizer filament 124. Additionally, the beam electronics 130 include a set of biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV.

As illustrated in FIG. 2, the beam electronics further include an anode power supply 134 that provides a voltage $V_A$ to an anode of ionizer 122 for accelerating electrons emitted from the filament 124 and causing the electrons to bombard the gas clusters in the gas jet 118, which produces cluster ions.

Additionally, as illustrated in FIG. 2, the beam electronics 130 include an extraction power supply 138 that provides a voltage $V_E$ to bias at least one of the high voltage electrodes 126 to extract ions from the ionizing region of the ionizer 122 and to form the GCIB 128. For example, an extraction power supply 138 provides a voltage to a first electrode of the high voltage electrodes 126 that is less than or equal to the anode voltage of the ionizer 122.

Furthermore, in one embodiment, the beam electronics 130 includes an accelerator power supply 140 that provides a voltage $V_{Acc}$ to bias one of the high voltage electrodes 126 with respect to the ionizer 122, which results in a total GCIB acceleration energy equal to about $V_{Acc}$ electron volts (eV). For example, the accelerator power supply 140 provides a voltage to a second electrode of the high voltage electrodes 126 that is less than or equal to the anode voltage of ionizer 122 and the extraction voltage of the first electrode.

In yet another embodiment, the beam electronics 130 includes lens power supplies 142 and 144 to bias the high voltage electrodes 126 with potentials (e.g., $V_{L1}$ and $V_{L2}$) to focus the GCIB 128. For example, the lens power supply 142 provides a voltage to a third electrode of the high voltage electrodes 126 that is less than or equal to the anode voltage of the ionizer 122, the extraction voltage of the first electrode, and the accelerator voltage of the second electrode. The lens power supply 144 provides a voltage to a fourth electrode of the high voltage electrodes 126 that is less than or equal to the anode voltage of the ionizer 122, the extraction voltage of the first electrode, the accelerator voltage of the second electrode, and the first lens voltage of the third electrode. A beam filter 146 in the ionization/acceleration chamber 106 eliminates monomers, or monomers and light cluster ions from the GCIB 128 to define a filtered process GCIB that enters the processing chamber 108. Referring still to FIG. 2, according to one embodiment, a beam gate 148 is disposed in the path of the GCIB 128 in the ionization/acceleration chamber 106. The beam gate 148 has an open state in which the GCIB 128 is permitted to pass from the ionization/acceleration chamber 106 to the processing chamber 108, and a closed state in which the GCIB 128 is prevented from entering the processing chamber 108. A control cable (for example) conducts control signals from a control system 190 to the beam gate 148. The control signals controllably switch beam gate 148 between the open or closed states. In one embodiment, the control cable is any desired transmission medium that permits signals to be transmitted from the control system 90 to the beam gate 148.

According to one embodiment, referring still to FIG. 2, one or more shaping apertures 127, coupled to the vacuum vessel 102, are disposed in the path of the GCIB 128 and aligned with the GCIB 128. The one or more shaping apertures 127 are configured to shape and/or size the GCIB 128 to produce a shaped GCIB 128A prior to the impingement of the shaped GCIB 128A on a substrate 152. For example, in one embodiment, the position of the one or more shaping apertures 127 is at any location along the length of the path of the GCIB 128, but the one or more shaping apertures 127 are preferably the last structure through which GCIB 128 passes prior to striking the substrate 152. The GCIB may pass other structure(s) prior to striking the substrate as long as these structure(s) do not substantially affect the shape of the GCIB.

According to one embodiment, the one or more shaping apertures 127 are characterized by a cross-sectional dimension. For example, the cross-sectional dimension includes a diameter or a width. The cross-sectional dimension is designed to be equal to or less than the full width half maximum (FWHM) of the GCIB 128. Additionally, the shape of the one or more shaping apertures 127 can be any desired shape such as a circle, an ellipse, a square, a rectangle, a triangle, or a cross-section having any arbitrary shape.

In one embodiment, the one or more apertures 127 includes a single aperture. In an alternative embodiment, the one or more apertures 127 includes a plurality of apertures, wherein each aperture is aligned with the GCIB 128 and positioned at a different axial location along the path of the GCIB 128. As an example, each aperture has the same size, or shape, or size and shape. Alternatively, each aperture varies from each other in size, or shape, or size and shape.

In yet another embodiment, the cross-sectional dimension of the one or more shaping apertures 127 is adjustable. For example, the one or more shaping apertures 127 includes an aperture adjustment device 129, such as a mechanically adjusting iris or a mechanically variable aperture having a rotatable wheel with multiple apertures of varying shape or size or both.

In one embodiment, the aperture adjustment device 129 is controlled by the control system 90 to adjust the cross-sectional dimension of the one or more shaping apertures 127. For example, the control system 90 instructs the aperture adjustment device 129 to increase or decrease an aperture size by rotating the rotatable wheel to a desired aperture.

The substrate 152, which is a wafer or semiconductor wafer, a flat panel display (FPD), a liquid crystal display (LCD), or any other desired substrate to be processed by GCIB processing, is disposed in the path of the shaped GCIB 128A in the processing chamber 108. In one embodiment, a scanning system uniformly scans the shaped GCIB 128A across large areas to produce spatially homogeneous results. The scanning system allows for processing of large substrates with spatially uniform results.

An X-scan actuator 160 provides linear motion of the substrate holder 150 in the direction of an X-scan motion (into and out of the plane of the paper). A Y-scan actuator 162 provides linear motion of the substrate holder 150 in the direction of a Y-scan motion 164, which is typically orthogonal to the X-scan motion. The combination of X-scanning and Y-scanning motions translates the substrate 152, held by the substrate holder 150, in a raster-like scanning motion through the shaped GCIB 128A to cause a uniform (or otherwise programmed) irradiation of a surface of the substrate 152 by the shaped GCIB 128A for processing of the substrate 152.

The substrate holder 150 disposes the substrate 152 at an angle with respect to the axis of the shaped GCIB 128A so that the shaped GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. In moving between the two positions, the substrate 152 is scanned through the shaped GCIB 128A, and in both extreme positions of the Y-scan motion, the substrate 152 is moved completely out of the path of the shaped GCIB 128A (over-scanned). Similar scanning and over-scan is performed in the orthogonal X-scan motion direction (in and out of the plane of the paper).

In one embodiment, a beam current sensor 180 is disposed beyond the substrate holder 150 in the path of the shaped GCIB 128A to intercept a sample of the shaped GCIB 128A when the substrate holder 150 is scanned out of the path of the shaped GCIB 128A. As an example, the beam current sensor 180 is a faraday cup or any other desired sensor, closed except for a beam-entry opening, and affixed to the wall of the vacuum vessel 102 with an electrically insulating mount 182.

According to one embodiment, as shown in FIG. 2, the control system 190 connects to the X-scan actuator 160 and the Y-scan actuator 162 through electrical cable. The control system 190 controls the X-scan actuator 160 and the Y-scan actuator 162 to place the substrate 152 into or out of the shaped GCIB 128A and to scan the substrate 152 uniformly relative to the shaped GCIB 128A to achieve desired processing of the substrate 152 by the shaped GCIB 128A. Control system 190 receives the sampled beam current collected by the beam current sensor 180 by way of an electrical cable and, thereby monitors the GCIB 128A. With the GCIB current known, the control system 90 controls a GCIB dose received by the substrate 152 by removing the substrate 152 from the shaped GCIB 128A when a predetermined dose has been delivered. In one embodiment, a GCIB dose is determined by applying a GCIB to the substrate 152 for a specified time at a specified resolution.

Figure 3:
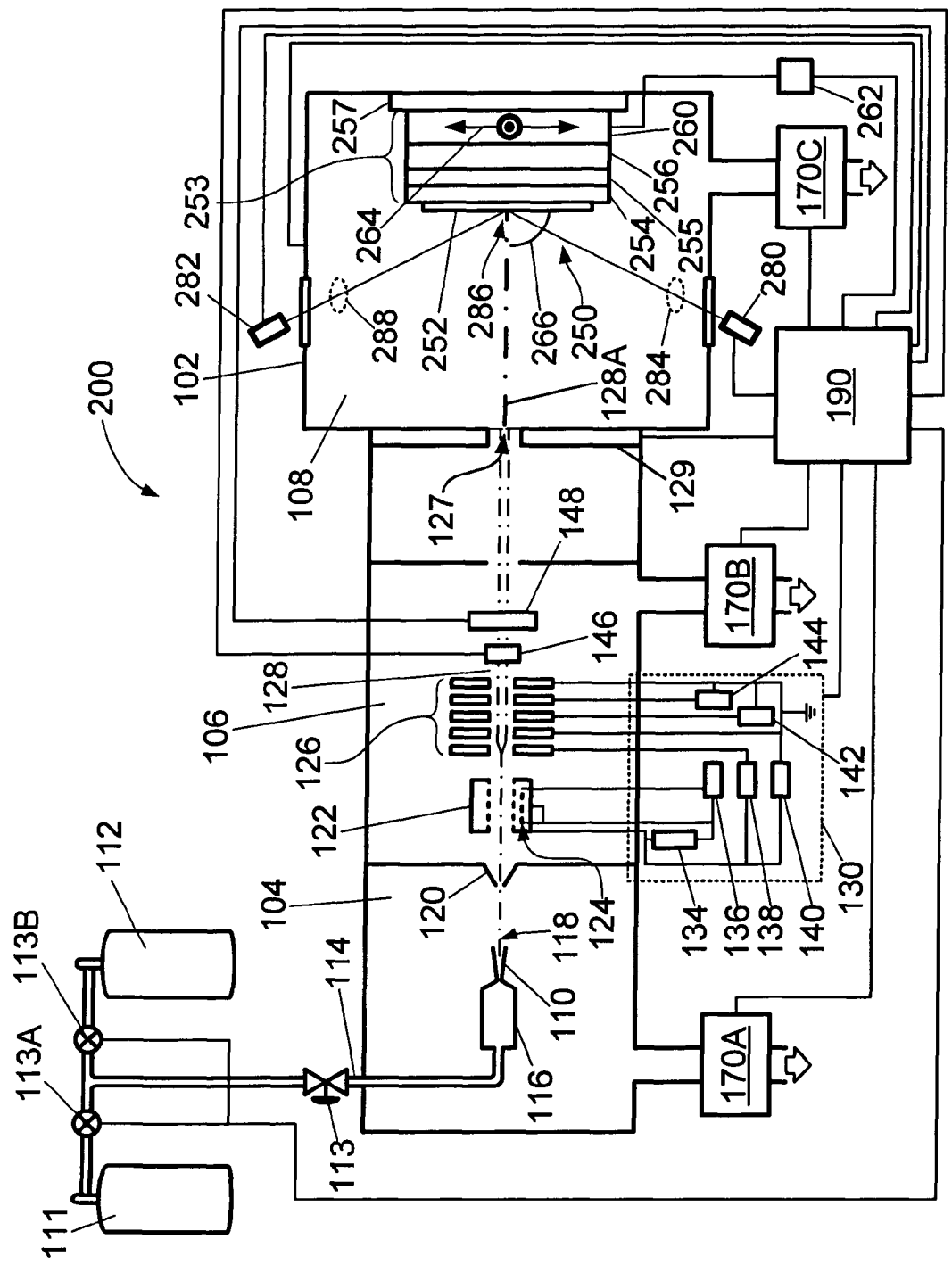
FIG. 3 is another illustration of a GCIB processing system.

In another embodiment shown in FIG. 3, a GCIB processing system 200 is similar to the embodiment illustrated in FIG. 2 and further comprises a X-Y positioning table 253 operable to hold and move a substrate 252 in two axes, effectively scanning the substrate 252 relative to the shaped GCIB 128A. For example, the X-motion includes motion into and out of the plane of the paper, and the Y-motion includes motion along the direction indicated by arrow 264.

The shaped GCIB 128A impacts the substrate 252 at a projected impact region 286 on a surface of the substrate 252. The X-Y positioning table 253 positions each portion of a surface of the substrate 252 in the path of shaped GCIB 128A so that every region of the surface is able to coincide with the projected impact region 286 for processing by the shaped GCIB 128A. An X-Y controller 262 provides electrical signals to the X-Y positioning table 253 through an electrical cable for controlling the position and velocity in each of the X-axis and Y-axis directions. In one embodiment, the X-Y controller 262 receives control signals from, and is operable by, control system 190 through an electrical cable. The X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan any portion of the substrate 252 through the projected impact region 286 for GCIB processing by the shaped GCIB 128A. Furthermore, the control system 190 controls the velocity that the substrate 252 moves through the projected impact region 286.

According to one embodiment, the positioning table 253 includes a substrate holding surface 254. The substrate holding surface 254 is electrically conductive and connected to a dosimetry processor operated by the control system 190. An electrically insulating layer 255 of positioning table 253 isolates the substrate 252 and substrate holding surface 254 from the other portions of the positioning table 253. An electrical charge induced in the substrate 252, by the impinging shaped GCIB 128A, is conducted through the substrate 252 and substrate holding surface 254, and a signal is coupled through the positioning table 253 to the control system 190 for dosimetry measurement. The dosimetry measurement integrates a GCIB current to determine a GCIB processing dose. For example, an amount of the GCIB current accumulated in the substrate 252 is proportional to the dosage level of the GCIB 128A the substrate has received. In one embodiment, a target-neutralizing source (not shown) of electrons, sometimes referred to as an electron flood, is used to neutralize the shaped GCIB 128A after a predetermined GCIB dose is received. As an example, a Faraday cup (not shown) is used to assure accurate dosimetry despite the added source of electrical charge.

An exemplary operation of the GCIB processing system 200 is next described. The control system 190 signals the opening of the beam gate 148 to irradiate the substrate 252 with the shaped GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. The above described operation is performed for each desired location of the substrate 252.

In an alternative embodiment, the shaped GCIB 128A is scanned at a constant velocity in a fixed pattern across the surface of the substrate 252. However, the GCIB intensity is modulated (i.e., Z-axis modulation) to deliver an intentionally non-uniform dose to the substrate 252. The GCIB intensity is modulated in the GCIB processing apparatus 200 by any desired method, including varying the gas flow from a GCIB source supply; modulating the ionizer by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. As an example, the modulating variations are continuous analog variations or are time modulated switching or gating.

In one embodiment, the processing chamber 108 includes an in-situ metrology system. For example, the in-situ metrology system includes an optical diagnostic system having an optical transmitter 280 and optical receiver 282 configured to illuminate the substrate 252 with an incident optical signal 284 and receive a scattered optical signal 288 from the substrate 252, respectively. The optical diagnostic system comprises optical windows to permit the passage of the incident optical signal and the scattered optical signal into and out of the processing chamber 108. Furthermore, the optical transmitter 280 and the optical receiver 282 includes transmitting and receiving optics, respectively. The optical transmitter 280 receives, and is responsive to, electrical signals from the control system 190. As an example, the optical receiver 282 returns measurement signals to the control system 190 upon receiving a request (i.e., signal) from the control system 190. In one embodiment, the in-situ metrology system includes any desired instrument configured to monitor the progress of the GCIB processing.

According to one embodiment, the control system 190 comprises a microprocessor, memory, and a digital I/O port capable of generating control voltages sufficient to communicate and activate inputs to GCIB processing system 100 (or 200) as well as monitor outputs from GCIB processing system 100 (or 200). Moreover, control system 190 is configured to exchange information with the vacuum pumping systems 170A, 170B, and 170C, the first gas source 111, second gas source 112, first gas control valve 113A, second gas control valve 113B, beam electronics 130, beam filter 146, beam gate 148, aperture adjustment device 129, the X-scan actuator 160, Y-scan actuator, and beam current sensor 180. For example, a program stored in the memory is executed to activate the inputs to the aforementioned components of GCIB processing system 100 (or 200) to perform the GCIB process on the substrate 152 (or 252). One example of the control system 190 is a DELL PRECISION WORKSTATION 610™, available from Dell Corporation, Austin, Tex.

According to one embodiment, the substrate 152 (or 252) is affixed to the substrate holder 150 (or substrate holder 250) via a clamping system (not shown), such as a mechanical clamping system or an electrical clamping system (e.g., an electrostatic clamping system). The substrate holder 150 (or 250) includes a heating system (not shown) or a cooling system (not shown) that is configured to adjust and/or control the temperature of substrate holder 150 (or 250) and substrate 152 (or 252).

In one embodiment, vacuum pumping systems 170A, 170B, and 170C include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP is employed. TMPs are useful for low pressure processing, typically less than about 50 mTorr. Furthermore, as an example, a device for monitoring chamber pressure (not shown) is coupled to the vacuum vessel 102 or any of the three vacuum chambers. The pressure measuring device is, for example, a capacitance manometer an ionization gauge, or any other desired pressure measuring device.

Figure 4:
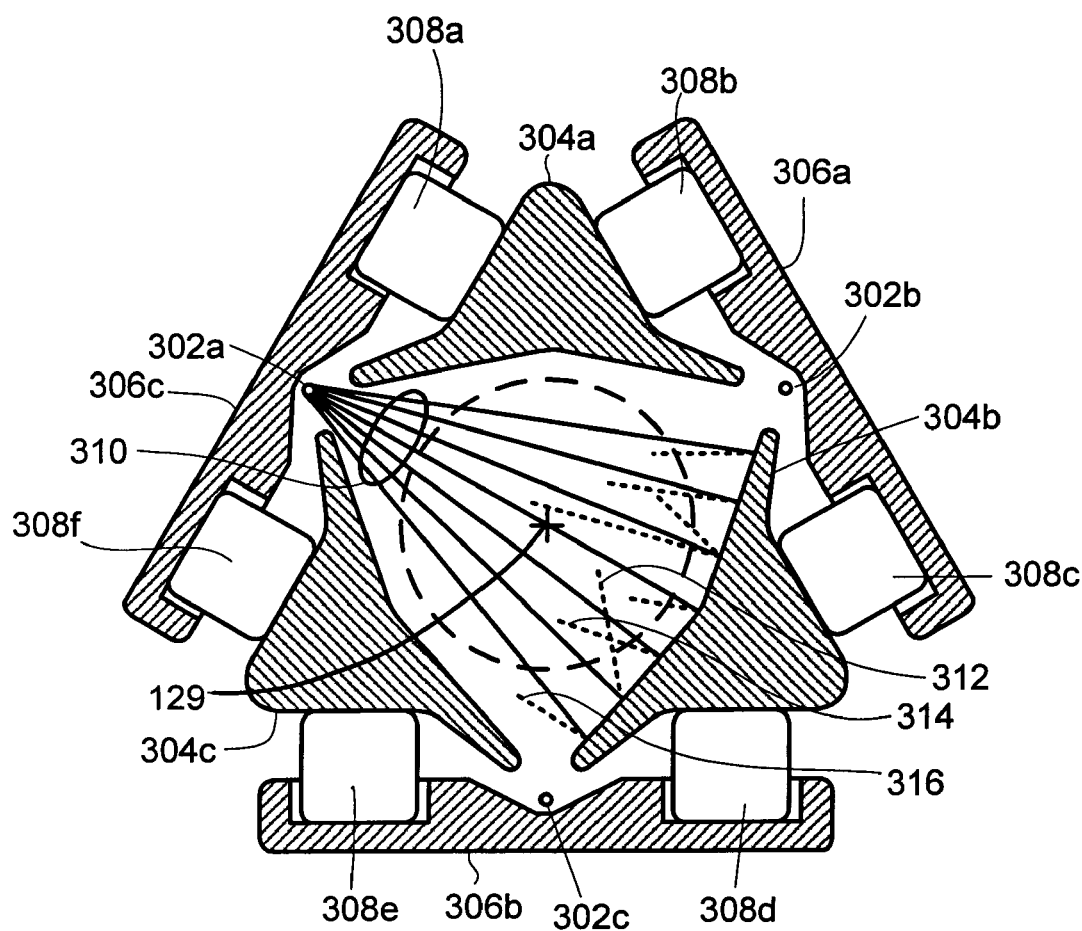
FIG. 4 is an illustration of an ionization source for a GCIB processing system.

Referring now to FIG. 4, a section 300 of an exemplary gas cluster ionizer for ionizing a gas cluster jet is shown. The section 300 is normal to the axis of the gas cluster beam 128. For typical gas cluster sizes (2000 to 15000 atoms), clusters leaving the skimmer aperture (120, FIGS. 1 and 2) and entering an ionizer (122, FIGS. 1 and 2) will travel with a kinetic energy of about 130 to 1000 electron volts (eV). At these low energies, any departure from a condition of space charge neutrality within the ionizer 122 results in a rapid dispersion of the gas jet with a significant loss of beam current. FIG. 4 illustrates a self-neutralizing ionizer. Gas clusters are typically ionized by electron impact. In this design, thermo-electrons (seven examples indicated by 310) are emitted from multiple linear thermionic filaments 302a, 302b, and 302c (typically tungsten) and are extracted and focused electric fields provided by electron-repeller electrodes 306a, 306b, and 306c and beam-forming electrodes 304a, 304b, and 304c. Thermo-electrons 310 pass through the gas cluster jet and jet axis, and then strike the opposite beam-forming electrode 304b to produce low energy secondary electrons (312, 314, and 316 indicated for examples).

Linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Referring back to FIG. 1, metrology system 10 is configured to acquire metrology data for a substrate. The metrology system 10 may include an ex-situ metrology system or it may include an in-situ metrology system. In one embodiment, metrology system 10 is located ex-situ of the GCIB processing system 30 (100 or 200 in FIG. 2 or 3), which means that the measurement equipment is located outside of the vacuum vessel (label 102 in FIGS. 2 and 3) and separate from the GCIB processing system 30 (100 or 200 in FIG. 2 or 3). In an alternative embodiment, the metrology system 10 is located in-situ and is therefore contained within the vacuum vessel (label 102 in FIGS. 2 and 3) to allow for in-vacuum measurements on the GCIB processing system 100 (or 200). As an example, metrology system 10 includes the optical diagnostic system depicted in FIG. 3. In yet another embodiment, the metrology system 10 is located in-situ outside of the vacuum vessel (label 102 in FIGS. 2 and 3) but is still considered part of the GCIB processing system 100 (or 200). For example, the metrology system 10 is located outside the GCIB processing system 100 (or 200) but connected to the control system 190.

Metrology system 10 comprises any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. In another embodiment, the metrology system 10 comprises an optical digital profilometer (ODP), a scatterometer, an ellipsometer, a reflectometer, an interferometer, or any combination of two or more thereof.

For example, the metrology system 10 constitutes an optical scatterometry system. The scatterometry system includes a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

Furthermore, referring still to FIG. 1, the multi-process controller 20 is configured to receive the metrology data from the metrology system 10, compute correction data for the substrate using the metrology data, and instruct the GCIB processing system 30 to apply completed correction data to the substrate using a gas cluster ion beam (GCIB).

Additionally, the multi-process controller 20 is configured to determine at least one spatial gradient of the metrology data at one or more locations on the substrate. As an example, a spatial gradient is a measure in a change of a substrate property (i.e., film thickness) at a location on the substrate. Using the determined at least one spatial gradient at one or more locations, the multi-process controller 20 instructs the GCIB processing system 30 or the operator of the GCIB processing system 30 to adjust at least one beam property in an established set of beam properties for the GCIB. For example, the at least one beam property includes a beam resolution, such as a cross-sectional beam dimension or a beam edge profile.

Furthermore, one or more correction steps are performed. For example, a first step is performed to correct, adjust, or smooth substrate surface asperities having high or finer spatial gradients. According to one embodiment, the first step includes using a GCIB having a finer beam resolution (e.g., a reduced cross-sectional dimension). Thereafter, a second step is performed to correct, adjust, or smooth substrate surface asperities having low or coarser spatial gradients. The second step includes using a GCIB having a coarser beam resolution (e.g., a nominal cross-sectional dimension or an enlarged cross-sectional dimension). A nominal beam cross-sectional dimension can represent the beam shape and size as a result of the formation of the GCIB without the use of a shaping aperture, including the formation of gas clusters, the ionization of the clusters, the acceleration of the ionized clusters, the focusing of the clusters, the filtering of the clusters, etc., as described for FIGS. 2 and 3. In an alternative embodiment, the first and second steps are reversed.

According to one embodiment, the multi-process controller 20 comprises a microprocessor, memory, and a digital I/O port capable of generating control voltages sufficient to communicate and activate inputs to the GCIB processing system 30 (100 or 200 in FIG. 2 or 3) as well as monitor outputs from GCIB processing system 30 (100 or 200 in FIG. 2 or 3). Moreover, multi-process controller 20 is configured to exchange information with metrology system 10 and GCIB processing system 30.

As an example, the multi-process controller 20 is implemented as a general purpose computer system that performs a portion or all of the microprocessor based processing steps of the invention in response to a processor executing one or more sequences of one or more instructions contained in a memory. Such instructions are read into the controller memory from another computer readable medium, such as a hard disk or a removable media drive. One or more processors in a multi-processing arrangement are employed as the controller microprocessor to execute the sequences of instructions contained in main memory. In alternative embodiments, hard-wired ASICS configured to perform the functionality of the GCIB processing systems 100 or 200 are used in place of or in combination with software instructions. Thus, embodiments are not limited to any specific combination of hardware circuitry and software.

As an example, the multi-process controller 20 is used to configure any number of processing elements, as described above, and the multi-process controller 20 collects, provides, processes, stores, and displays data from the processing elements. The multi-process controller 20 includes a number of applications, as well as a number of controllers, for controlling one or more of the processing elements. For example, multi-process controller 20 includes a graphical user interface (GUI) component (not shown) that provides interfaces that enable a user to monitor and/or control one or more processing elements.

The multi-process controller 20 is locally located relative to the GCIB processing system 30 (100 or 200 in FIG. 2 or 3), or it is remotely located relative to the GCIB processing system 30 (100 or 200 in FIG. 2 or 3). For example, multi-process controller 20 is configured to exchange data with the GCIB processing system 30 (100 or 200 in FIG. 2 or 3) using a direct connection, an intranet, and/or the internet. Multi-process controller 20 is coupled to an intranet at, for example, a customer site (i.e., a device maker, etc.), or it is coupled to an intranet at, for example, a vendor site (i.e., an equipment manufacturer). Alternatively or additionally, the multi-process controller 20 is coupled to the internet. In yet another embodiment, another computer (i.e., controller, server, etc.) accesses the multi-process controller 20 to exchange data via a direct connection, an intranet, and/or the internet.

Figure 8:
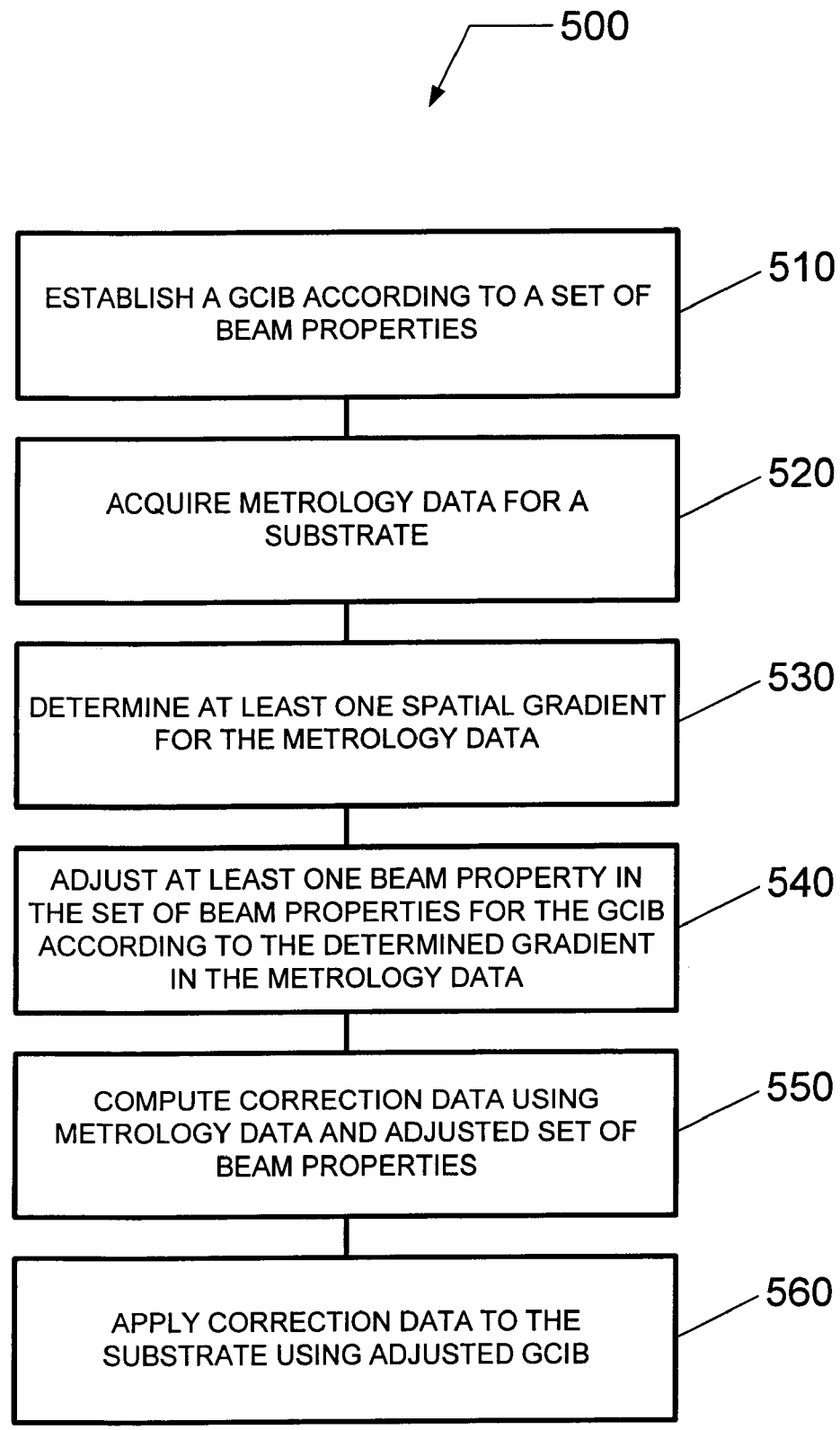
FIG. 8 illustrates a method of treating a substrate according to another embodiment.

Referring now to FIG. 8, a method of location specific processing on a substrate is described according to an embodiment. The method comprises a flow chart 500 beginning in 510 with establishing a GCIB according to a set of beam properties. In another embodiment, one or more GCIBs are established in one or more GCIB processing systems according to one or more sets of beam properties. For example, a GCIB is established in any one of or combination of GCIB processing systems described above, such as those presented in FIG. 2 or FIG. 3.

A set of beam properties include, but are not limited to, a set of mechanical parameters, electrical parameters, or chemical parameters, or any combination of parameters utilized to prepare and form a GCIB of pre-specified qualities. For example, mechanical parameters can include, but are not limited to, a nozzle size, a nozzle geometry, a skimmer plate geometry, a shaping aperture size, a shaping aperture shape, a gas temperature, a nozzle stagnation pressure, a gas pressure in any of the chambers of the vacuum vessel, or any combination of two or more thereof. Additionally, for example, electrical parameters can include, but are not be limited to, an ionizer filament voltage, an extraction electrode voltage, a focusing lens electrode voltage, an acceleration electrode voltage, or any combination of two or more thereof. Additionally yet, for example, chemical parameters include, but are not limited to, a gas composition.

Figure 7:
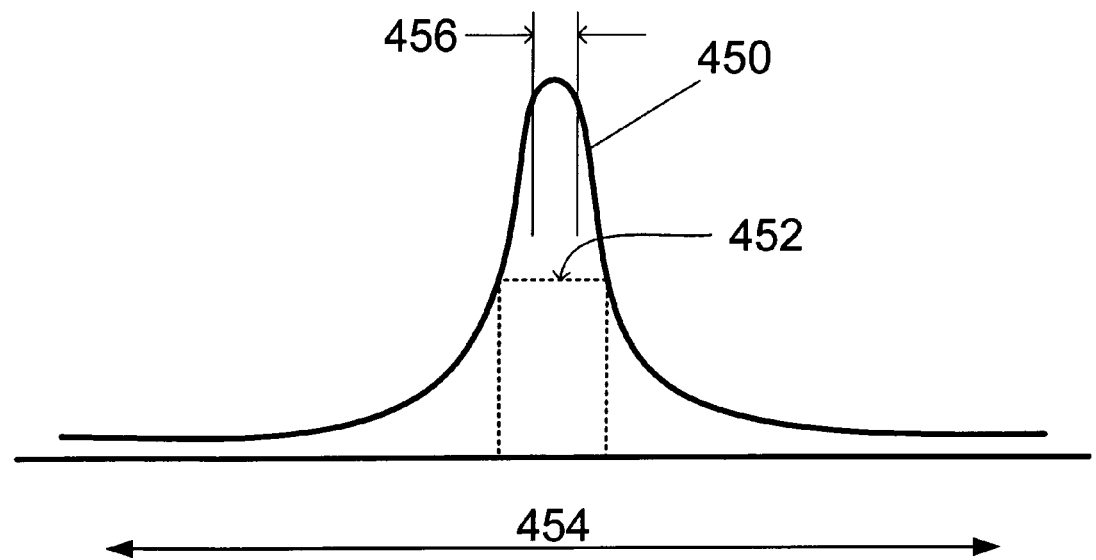
FIG. 7 illustrates an exemplary profile of beam intensity across a GCIB.

In one embodiment, any one or combination of these parameters are utilized to form a GCIB in a GCIB processing system having a beam profile that substantially approximates a Gaussian profile as illustrated in FIG. 7. In other embodiments, other beam profiles are possible.

As shown in FIG. 7, a beam profile 450 having a substantially Gaussian profile is formed. At an axial location along the length of the GCIB (e.g., the substrate surface), the beam profile is characterized by a full width at half maximum (FWHM) 452 and a maximum width 454 (e.g., full width at 5% the peak intensity).

After establishing the GCIB, flow proceeds to 520, where metrology data is acquired for a substrate. The metrology data can include parametric data, such as geometrical, mechanical, electrical and/or optical parameters associated with the upper layer or one or more devices formed in or on the upper layer of the substrate. For example, metrology data includes, but is not limited to, any parameter measurable by the metrology systems described above. Additionally, for example, metrology data includes measurements for a film thickness, a film height, a surface roughness, a surface contamination, a feature depth, a trench depth, a via depth, a feature width, a trench width, a via width, a critical dimension (CD), an electrical resistance, or any combination of two or more thereof. Furthermore, for example, metrology data can include one or more measurable parameters for one or more surface acoustic wave (SAW) devices, such as a SAW frequency.

Figure 5:
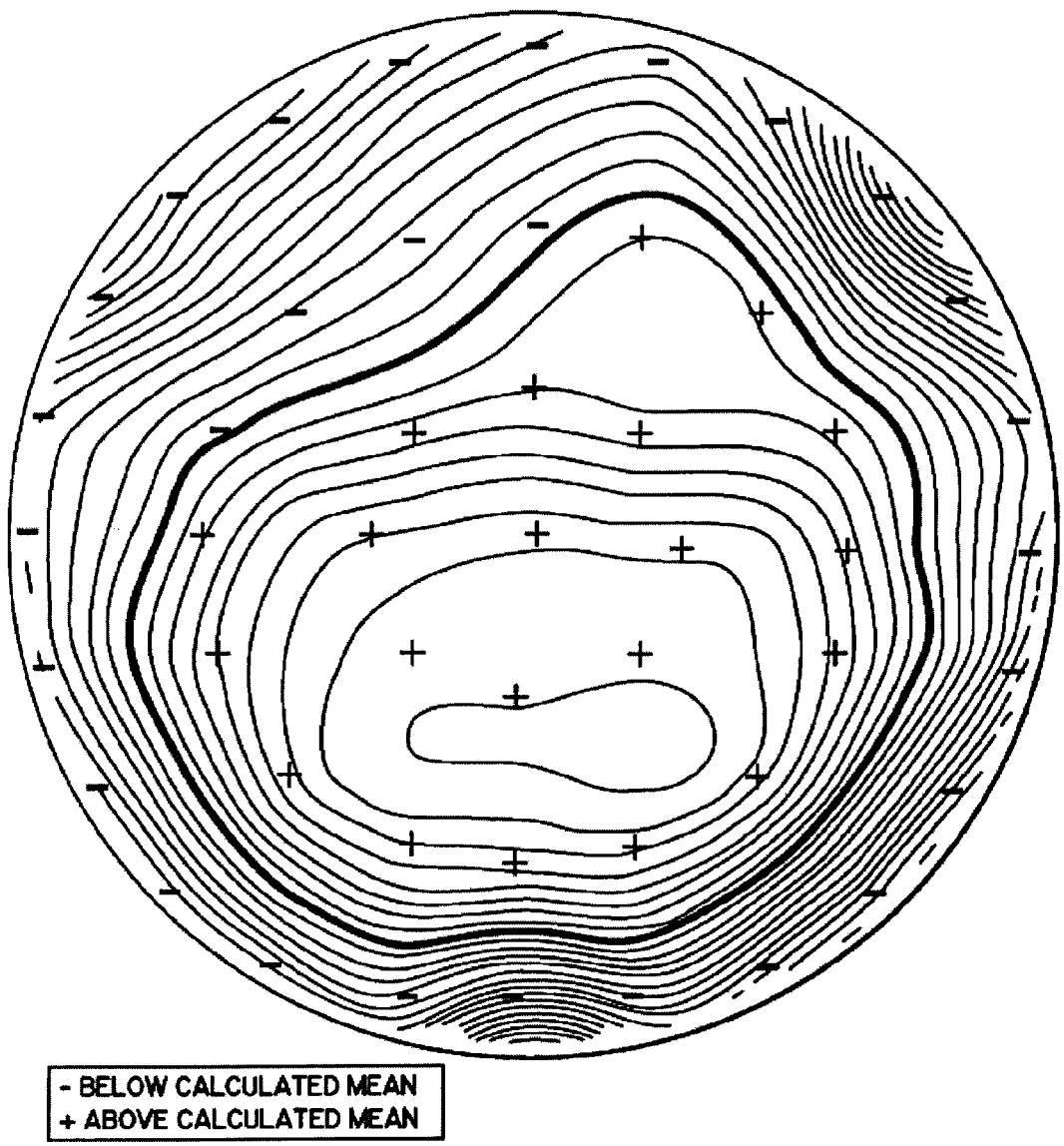
FIG. 5 illustrates correction data for a substrate.

According to one example, FIG. 5 illustrates a film-thickness map of a wafer with an upper layer comprising a thin film or layer as measured by a spectroscopic ellipsometry instrument such as a commercially available model UV-1280SE thin film measurement instrument manufactured by KLA-Tencor Corporation. As illustrated in FIG. 5, the thickness of a thin film on a substrate is mapped as a function of position on the substrate.

For example, such a measurement of the initial thickness non-uniformity of an upper film layer on a substrate is characterized ex-situ of the GCIB processing system by spectroscopic ellipsometry or other suitable conventional techniques. Such techniques produce a point-by-point film thickness map that is reduced to thickness contours (or similar) as shown in FIG. 5. In an alternative embodiment, an in-situ uniformity-mapping instrument using spectroscopic ellipsometry or other suitable conventional film thickness mapping techniques is incorporated within the GCIB processing system (100 or 200 in FIG. 2 or 3) for checking a profiling process. In either case, the non-uniformity measurements are stored as a series of thickness points with precise substrate positions by a standard computer. As an example, a film measurement method such as spectroscopic ellipsometry is used to map the thickness of only the top film layer, independent of variations in substrate thickness, thickness of underlying films, or surface flatness.

As illustrated in FIG. 5, metrology data is measured at two or more locations on the substrate. In another embodiment, this data is acquired and collected for a plurality of substrates. The plurality of substrates, for example, may include a cassette of substrates. The metrology data is measured at two or more locations on a substrate and, for example, is acquired at a plurality of locations on the substrate. Thereafter, the plurality of locations indicating the film-thickness on the substrate is expanded from the measured sites to the unmeasured sites using a data fitting algorithm. For example, the data fitting algorithm includes interpolation (linear or nonlinear), extrapolation (linear or nonlinear), or a combination thereof. By fitting the metrology data, one or more mathematical representations of the metrology data is produced. An example of a data fitting algorithm is found in Matlab commercially available from The MathWorks, Inc. (3 Apple Hill Drive, Natick, Mass. 01760), the entire contents of which are incorporated by reference herein.

In other embodiments, when metrology data for a substrate includes measurements for a film height, a surface roughness, etc., the data fitting process described above is also performed to obtain data points for the unmeasured sites on the substrate. In an alternative embodiment, metrology data is obtained for the entire substrate and the data fitting process is not performed.

Once the metrology data is collected for the substrate using the metrology system 10, the metrology data is provided to the multi-process controller 20 for computing correction data. Metrology data is communicated between the metrology system 10 and the multi-process controller 20 via a physical connection (e.g., a cable), or a wireless connection, a combination thereof, or any other desired transmission medium. In another embodiment, the metrology data is communicated via an intranet or internet connection. Alternatively, the metrology data is communicated between the metrology system 10 and the multi-process controller 20 via a computer readable medium.

Figure 6:
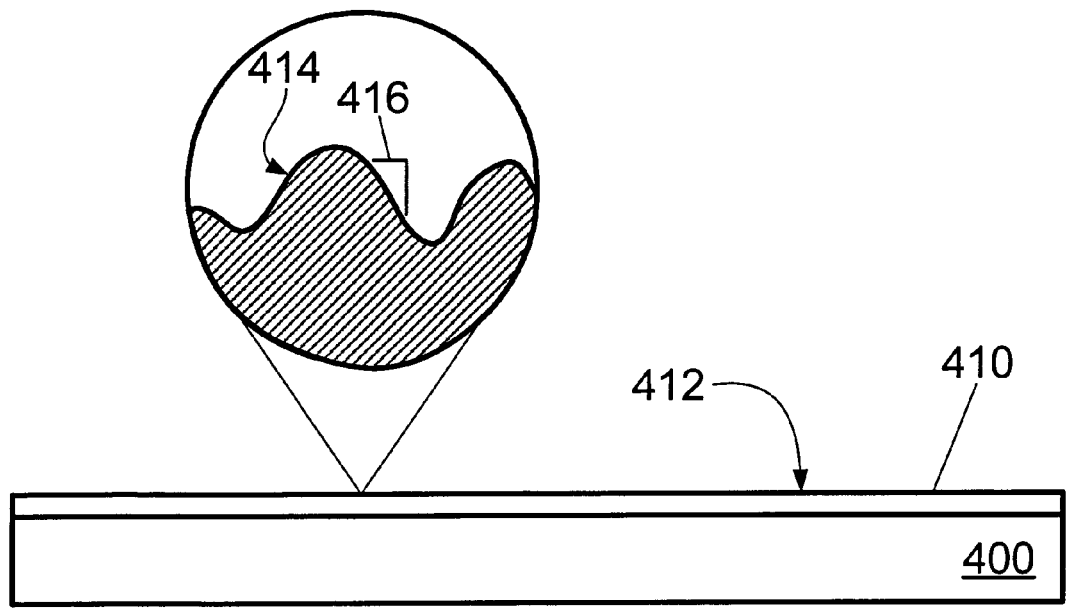
FIG. 6 illustrates surface asperities on a substrate.

After the metrology data is acquired, flow proceeds to 530, where at least one spatial gradient for the metrology data is determined at one or more locations on the substrate. As illustrated in FIG. 6, a substrate 400 may comprise one or more layers 410 having an upper surface 412. The metrology data, described above, pertains to one or more properties of the upper surface 412. For example, the metrology data comprises a surface height or film thickness. As illustrated in the enlarged view of surface 412, the surface height or film thickness may exhibit surface undulations or asperities 414. According to one embodiment, these surface undulations 414 are removed or smoothed using location specific processing to correct or adjust the profile of the surface height or the film thickness to a target distribution.

Also, as shown in FIG. 6, the surface undulations 414 can be characterized by a maximum slope 416 (i.e., gradient). As an example, the maximum slope 416 is measured by the change in the surface height divided by a corresponding length of the substrate 400. A higher slope value indicates a sharper surface undulation on the substrate. A beam resolution used to correct the surface undulation 414 is proportional to the sharpness of the maximum slope 416. For example, the sharper the maximum slope 416, the finer the beam resolution used to adjust or correct the surface undulations 414 on the substrate surface 412. Therefore, according to another embodiment, the determination of at least one spatial gradient of the metrology data on substrate surface 412 is utilized to select a beam resolution, such as a beam cross-sectional dimension or a beam edge profile.

After the spatial gradient is determined, flow proceeds to 540, where at least one beam property in the set of beam properties, described above for the GCIB, is adjusted according to the determined spatial gradient(s) in the metrology data. For example, the at least one beam property comprises any one or more of the mechanical, electrical, or chemical parameters described above. Additionally, for example, the at least one beam property comprises a beam shape and/or beam size. In order to shape or size the beam (or adjust the beam resolution), a shaping aperture (as described above) may be utilized to shape or size the GCIB.

The shaping aperture can be characterized by a cross-sectional dimension. The cross-sectional dimension may include a diameter or a width. Additionally, the shape of the one or more shaping apertures can include a circle, an ellipse, a square, a rectangle, a triangle, or a cross-section having any arbitrary shape. Referring again to FIG. 7, a GCIB can be formed having the beam profile 450, which substantially approximates a Gaussian profile. As an example, the cross-sectional dimension 456 of the aperture is selected to comprise a diameter less than or equal to the FWHM of the GCIB.

In this regard, the present inventors have recognized that a given GCIB processing chamber is limited to producing a minimal beam resolution (e.g., beam width or diameter), making fine variations in the substrate surface difficult to correct using the GCIB. Therefore, as described above for an embodiment, one or more shaping apertures may be used to improve GCIB resolution over conventional systems limited by conventional beam parameters. Additionally, each shaping aperture is aligned with the GCIB and positioned along an axial length of the GCIB.

Furthermore, the cross-sectional dimension of the shaping aperture can be adjustable. For example, the shaping aperture includes an aperture adjustment device, such as a mechanically adjusting iris or a mechanically variable aperture having a rotatable wheel with multiple apertures of varying shape. As an example, once the at least one spatial gradient is obtained, the system controller 190 instructs the aperture adjustment device 129 (see FIG. 2) to rotate the rotatable wheel to an aperture corresponding to the desired beam resolution.

In another embodiment, to adjust the sharpness of the beam edge profile, one or more shaping apertures located in close proximity with the substrate surface is utilized. In order to improve the beam resolution, the beam edge profile is intensified such that the maximum slope of the beam profile is substantially equivalent to or exceeds the maximum gradient determined for the metrology data.

Flow proceeds from 540 to 550 where correction data is computed for the substrate using the metrology data and the beam properties of the GCIB. The correction data for the substrate comprises a process condition for modulation of the GCIB dose as a function of position on the substrate in order to achieve a change between the parametric data associated with the incoming metrology data and the target parametric data for the given substrate. As an example, target parametric data corresponds to a desired change for a substrate property such as film thickness. Therefore, for each location on the substrate, a GCIB dosage is calculated for changing a substrate property (i.e., film thickness) to correspond to the target data. In one embodiment, the correction data for the substrate comprises determining a process condition for using the GCIB to correct a non-uniformity of the parametric data for the substrate. In another embodiment, the correction data for the substrate comprises determining a process condition for using the GCIB to create a specifically intended non-uniformity of the parametric data for the substrate.

Using an established relationship between the desired change in the parametric data and the GCIB dose, and an established relationship between the GCIB dose and a GCIB process condition having a set of GCIB processing parameters, the multi-process controller 20 determines correction data for the substrate. For example, a mathematical algorithm is employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters are determined to affect the calculated beam dose contour using the relationship between the beam dose and the GCIB process condition. In one embodiment, the GCIB processing parameters include a beam dose, a beam area, a beam profile, a beam intensity, a beam scanning rate, or an exposure time (or beam dwell time), or any combination of two or more thereof.

A relationship between a beam width and GCIB dose is next illustrated. After determining a desired change in a substrate property (i.e., film thickness) at a particular location on a substrate, a beam width A is selected. Accordingly, a time t1 is calculated for applying the GCIB at beam width A to the substrate to achieve the desired change. If a beam width B is selected, where B<A, a different time t2 is calculated for applying the GCIB at width B to achieve the desired change. Since B<A, the calculated time t2 is longer than t1 because a reduction in beam width reduces the beam current (i.e., flux).

Many different approaches to the selection of a mathematical algorithm to compute the correction data may be successfully employed in this embodiment. In another embodiment, the beam dose contour may selectively deposit additional material to achieve the desired change in parametric data.

Flow proceeds from 550 to 560 where the computed correction data for the substrate is applied to the substrate using a gas cluster ion beam (GCIB). Additionally, for example, the GCIB processing system comprises the GCIB processing system described in FIG. 2 or 3. Once processed to GCIB specifications, the uniformity of the substrate(s) or distribution of the parametric data for the substrate(s) are examined either in-situ or ex-situ and the process is finished or refined as appropriate. For example, after the substrate is processed, steps 520 to 540 are repeated again to further correct any non-uniformities not corrected in the first pass.

According to one embodiment, one or more correction application steps is performed. For example, a first step is performed to correct, adjust, or smooth substrate surface asperities having high or finer spatial gradients. The first step includes using a GCIB having a finer beam resolution (e.g., a reduced cross-sectional dimension). Thereafter, a second step is performed to correct, adjust, or smooth substrate surface asperities having low or coarser spatial gradients. The second step includes using a GCIB having a coarser beam resolution (e.g., nominal or an expanded cross-sectional dimension). A nominal beam cross-sectional dimension represents the beam shape and size as a result of the formation of the GCIB, including the formation of gas clusters, the ionization of the clusters, the acceleration of the ionized clusters, the focusing of the clusters, the filtering of the clusters, etc., as described by FIGS. 2 and 3. The first and second steps is performed in the same GCIB processing chamber or in different GCIB processing chambers.

Figure 9:
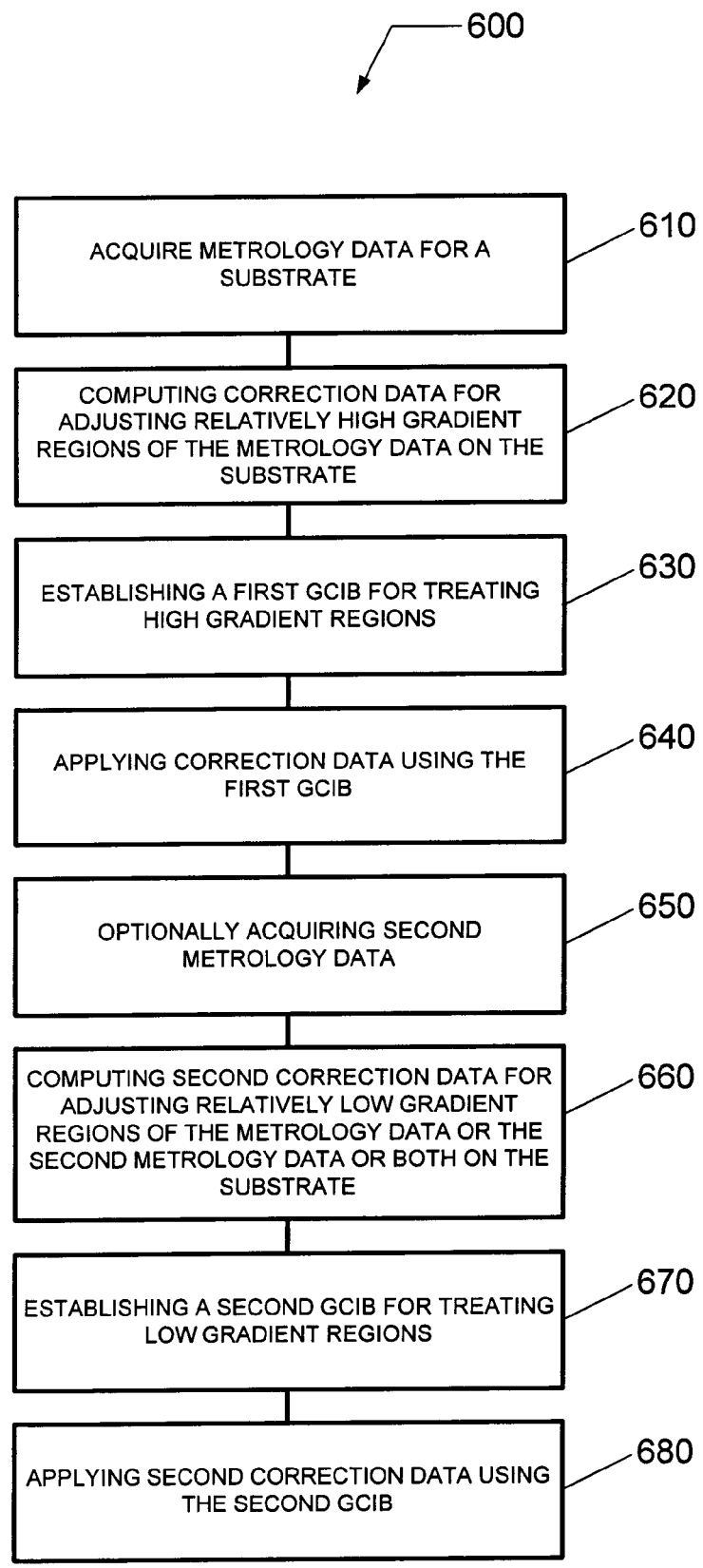
FIG. 9 illustrates a method of treating a substrate according to yet another embodiment.

Referring now to FIG. 9, a method of location specific processing on a substrate is described according to another embodiment. The method comprises performing two or more correction steps. For example, a first step is performed to correct, adjust, or smooth substrate surface asperities having high or finer spatial gradients using a GCIB having a finer beam resolution. Thereafter, a second step is performed to correct, adjust, or smooth substrate surface asperities having low or coarser spatial gradients using a GCIB having a coarser beam resolution. By using two or more steps with different beam resolution, the substrate throughput is enhanced due to faster processing rates with a larger GCIB. The method comprises a flow chart 600 beginning in 610 with acquiring metrology data for a substrate.

In 620, correction data is computed for adjusting relatively high gradient regions of the metrology data on the substrate.

In 630, a GCIB is established in a GCIB processing system for treating fine resolution surface variations or gradients.

In 640, correction data is applied to the substrate using the GCIB configured to treat fine resolution surface variations or gradients.

In 650, second metrology data is optionally acquired following the first application of correction data to the substrate.

In 660, second correction data is computed for adjusting relatively coarse gradient regions of the metrology data on the substrate.

In 670, a second GCIB is established in a GCIB processing system for treating coarse resolution surface variations or gradients.

In 680, the second correction data is applied to the substrate using the second GCIB configured to treat coarse resolution surface variations or gradients.

According to one embodiment, GCIB processing system comprises separate GCIB processing chambers for forming the GCIB to treat fine gradients and the second GCIB to treat coarse gradients. In an alternative embodiment, the GCIB processing system comprises one GCIB processing chamber for forming the GCIB to treat fine gradients and the second GCIB to treat coarse gradients.

As described above, the beam resolution is adjusted by adjusting the size of the GCIB. Without a shaping aperture, a GCIB is produced in a GCIB processing chamber using a set of beam parameters as described above. For a given GCIB processing system, a minimum beam resolution is achieved. Typically, the nominal beam size is approximately 20 to 30 mm with a FWHM dimension of approximately 10 mm. Therefore, fine variations or gradients include those variations persisting over scales less than or equal to the FWHM of the nominal beam size (without a shaping aperture) for a GCIB processing system, and coarse variations or gradients include those variations persisting over scales greater than the FWHM of the nominal beam size for a GCIB processing system.

Figure 10A:
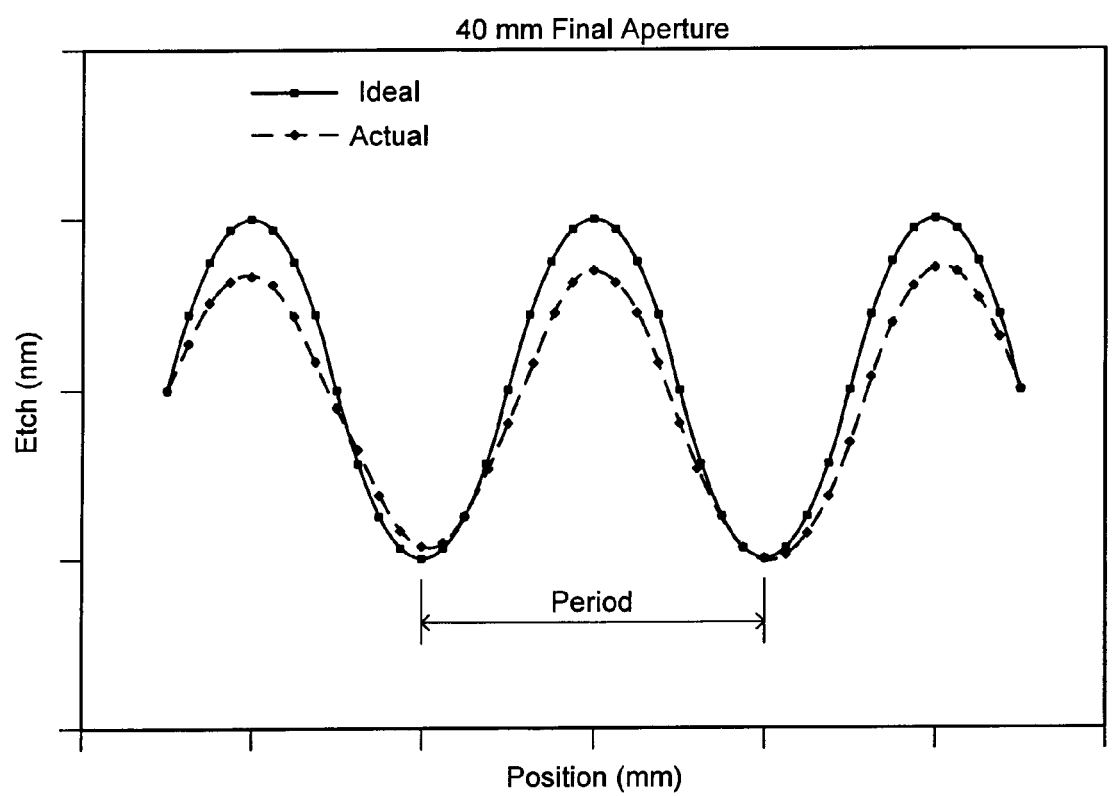
FIGS. 10A and 10B provide exemplary data for treating a substrate with a GCIB.
Figure 10B:
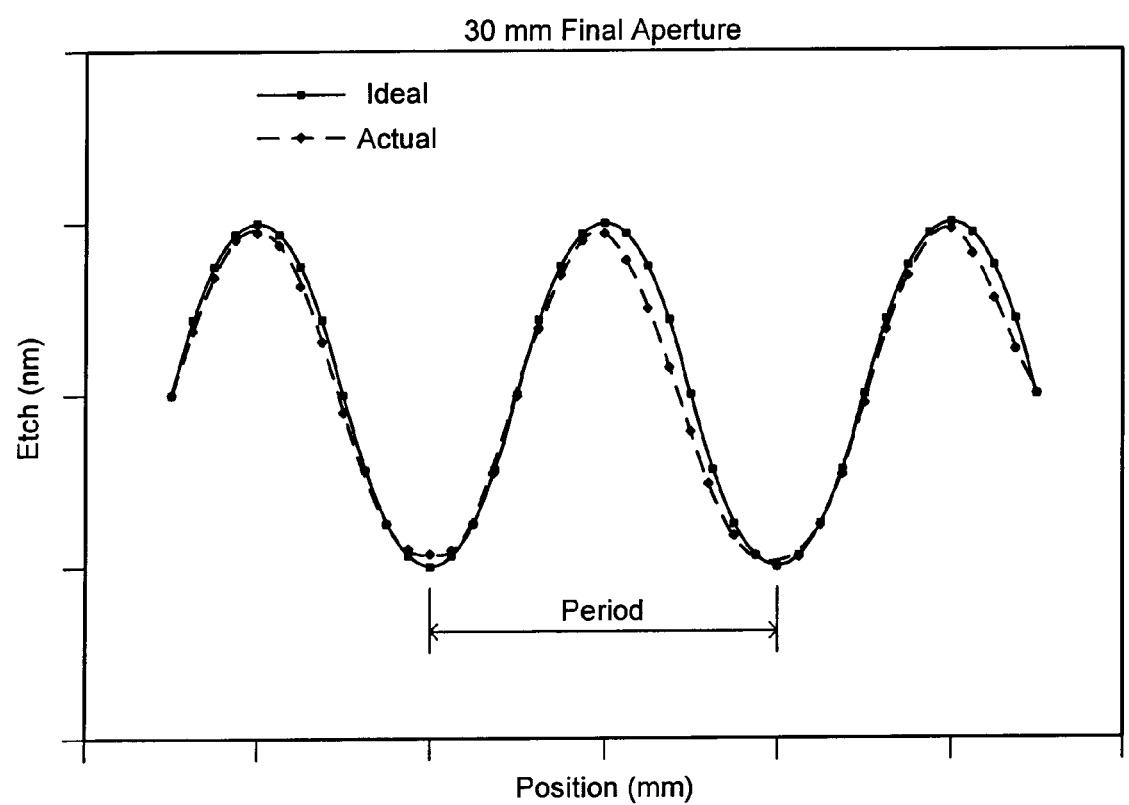

Referring now to FIGS. 10A and 10B, exemplary data for treating a substrate is provided in order to illustrate the effect of the final aperture size on location specific processing in a GCIB processing system. As shown in FIGS. 10A and 10B, a GCIB processing system is programmed to create (by etching) a pattern of sinusoidal "moguls" in a substrate having a period of 40 mm. The ideal or target result is identified as a solid line marked with solid squares, and it is the same for each figure. In FIG. 10A, a final aperture having a diameter of 40 mm is utilized, while in FIG. 10B, a final aperture having a diameter of 30 mm is utilized. The actual result is identified as a dashed line marked with solid diamonds for each case. In the latter case, the 30 mm diameter final aperture, the actual result captures the ideal (or target) result more closely.

Criteria for selecting an aperture size can depend on a desired accuracy versus a processing time. For example, the 30 mm aperture, which provides a higher beam resolution than the 40 mm aperture, provides higher accuracy in approximating the target result compared to the 40 mm aperture. Accordingly, the mm aperture is more suitable for treating finer gradients. However, because the beam width for the 30 mm aperture is smaller than the beam width for the 40 mm aperture, the processing time for treating the substrate is increased. Thus, the 40 mm aperture may be more suitable for treating coarser gradients. [PLEASE CONFIRM]

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for location specific processing of asperities on a substrate, comprising:
    establishing a gas cluster ion beam (GCIB) according to a set of beam properties;
    acquiring metrology data for said substrate;
    determining multiple different asperities each having a different spatial gradient and a different location on said substrate, based on said metrology data;
    computing correction data for processing each of said multiple different asperities on said substrate using said metrology data and said set of beam properties;
    adjusting at least one beam property in said set of beam properties for said GCIB to establish an adjusted GCIB having predetermined characteristics for treating one of said multiple different asperities having a determined spatial gradient and location
    applying said adjusted GCIB to said one of said multiple different asperities at its location on the substrate, according to said correction data; and
    repeating said adjusting and applying steps for each other of said multiple different asperities having a respective different spatial gradient and a respective different location on the substrate, wherein said predetermined characteristics include a beam edge profile having a maximum slope equivalent to or exceeding a maximum gradient of a respective asperity.

2. The method of claim 1, wherein said metrology data for said substrate comprises a film thickness, a surface roughness, a surface contamination, a feature depth, a trench depth, a via depth, a feature width, a trench width, a via width, a critical dimension (CD), or an electrical resistance, or any combination of two or more thereof.

3. The method of claim 1, wherein said metrology data for said substrate comprises one or more measurable parameters for one or more surface acoustic wave (SAW) devices.

4. The method of claim 1, wherein said determining a spatial gradient comprises:
    applying a fitting algorithm to said metrology data for said measurements at each of said multiple locations on said substrate to produce one or more mathematical representations of said metrology data for unmeasured sites on said substrate; and
    differentiating said one or more mathematical representations in space to compute said spatial gradient for each respective asperity.

5. The method of claim 4, wherein said applying said fitting algorithm comprises applying interpolation or extrapolation or both.

6. The method of claim 1, wherein said adjusting at least one beam property comprises adjusting a beam cross-sectional dimension or a spatial gradient in beam intensity or both.

7. The method of claim 1, wherein said adjusting at least one beam property comprises adjusting a beam shape.

8. The method of claim 1, wherein said adjusting at least one beam property in said set of beam properties comprises reducing a cross-sectional dimension of said established GCIB using an aperture having a diameter less than or equal to the full width half maximum (FWHM) dimension of said GCIB.

9. The method of claim 1, wherein said computing said correction data for said substrate comprises determining a process condition for using said GCIB to correct a non-uniformity of said metrology data for said substrate.

10. The method of claim 1, wherein said computing said correction data for said substrate comprises determining a process condition for using said GCIB to create a specifically intended non-uniformity of said metrology data for said substrate, and said process condition is a modulation of a GCIB beam dose as a function of position on said substrate.

11. The method of claim 1, wherein said using said GCIB comprises using a GCIB having ionized clusters, said ionized clusters comprising helium, neon, argon, krypton, xenon, nitrogen, oxygen, carbon dioxide, sulfur hexafluoride, nitric oxide, or nitrous oxide, or any combination of two or more thereof.

12. The method of claim 1, wherein said applying said GCIB to said substrate according to said correction data comprises using said GCIB and varying a beam dose, a beam area, a beam profile, a beam intensity, a beam scanning rate, or an exposure time, or any combination of two or more thereof.

13. The method of claim 1, wherein said acquiring metrology data for said substrate comprises measuring metrology data for said substrate using an in-situ metrology system or an ex-situ metrology system.

14. The method of claim 1, wherein said acquiring metrology data for said substrate comprises measuring metrology data for said substrate using an optical digital profilometer (ODP), a scatterometer, an ellipsometer, a reflectometer, an interferometer, an X-ray fluorescence spectroscopy tool, SEM, TEM, AFM, or a four-point probe, or any combination of two or more thereof.

15. The method of claim 1, further comprising determining each of the multiple spatial gradients by characterizing undulations on the substrate by a maximum slope measured by a change in surface height divided by a corresponding length of the substrate.

16. The method of claim 7, wherein said adjusting a beam shape comprises applying a plurality of axially aligned shaping apertures to the GCIB.

17. The method of claim 7, wherein said adjusting a beam shape comprises applying the shaping aperture to select a beam cross-sectional dimension or a beam edge profile.

18. The method of claim 1, wherein said adjusting at least one beam property comprises tailoring a beam resolution to process a particular asperity based on the detected spatial gradient of the asperity.

* * * * *